United States Patent
Zhang

(10) Patent No.: US 7,077,731 B1
(45) Date of Patent: Jul. 18, 2006

(54) CHEMICAL MECHANICAL PLANARIZATION (CMP) SYSTEM AND METHOD FOR PREPARING A WAFER IN A CLEANING MODULE

(75) Inventor: Xiuhua Zhang, Cupertino, CA (US)

(73) Assignee: Lam Research Corporation, Fremont, CA (US)

( * ) Notice: Subject to any disclaimer, the term of this patent is extended or adjusted under 35 U.S.C. 154(b) by 86 days.

(21) Appl. No.: 10/743,963

(22) Filed: Dec. 22, 2003

(51) Int. Cl.
*B24B 7/00* (2006.01)

(52) U.S. Cl. ........................ 451/194; 451/210
(58) Field of Classification Search ............... 451/194, 451/209, 210
See application file for complete search history.

(56) References Cited

U.S. PATENT DOCUMENTS

| | | | |
|---|---|---|---|
| 5,868,857 A * | 2/1999 | Moinpour et al. ............. 134/6 |
| 6,200,201 B1 * | 3/2001 | Ravkin et al. ................. 451/65 |
| 6,328,640 B1 * | 12/2001 | Jones et al. .................. 451/194 |
| 6,334,229 B1 * | 1/2002 | Moinpour et al. .............. 15/77 |
| 6,616,516 B1 * | 9/2003 | Ravkin et al. ............... 451/194 |
| 6,625,835 B1 * | 9/2003 | Frost et al. ...................... 15/77 |
| 6,837,777 B1 * | 1/2005 | Ziemins et al. ............... 451/44 |
| 2002/0173872 A1 * | 11/2002 | Malik ......................... 700/164 |

* cited by examiner

*Primary Examiner*—M. Rachuba
(74) *Attorney, Agent, or Firm*—Martine Penilla & Gencarella, LLP

(57) ABSTRACT

A method for preparing a wafer in a cleaning module is described. In this method, slurry is dispensed onto a surface of a wafer. Next, a chemical mechanical planarization (CMP) operation is conducted in the cleaning module by contacting a surface of a brush with the surface of the wafer. Subsequently, a cleaning operation is conducted in the cleaning module. A CMP pad and a CMP system also are described.

9 Claims, 6 Drawing Sheets

CHEMICAL MECHANICAL PLANARIZATION (CMP) SYSTEM AND METHOD FOR PREPARING A WAFER IN A CLEANING MODULE

BACKGROUND OF THE INVENTION

The present invention relates generally to semiconductor fabrication and, more particularly, to a chemical mechanical (CMP) system and method for preparing a wafer in a cleaning module.

In the fabrication of semiconductor devices, there is a need to perform chemical mechanical polishing (CMP) operations and wafer cleaning. As is known to those skilled in the art, CMP is used to planarize globally the surface of an entire semiconductor wafer. After a CMP operation, residual particles or films are left on the surface of the wafer. These residual particles or films may cause defects such as scratches on the wafer surface which may cause devices on the wafer to become inoperable. To avoid damaging the devices, the wafer needs to be cleaned after the CMP operation.

FIG. 1 is a simplified schematic diagram of a conventional CMP system 10 and cleaning station 18. During the fabrication of semiconductor devices, a number of CMP operations are typically carried out (e.g., bulk copper removal, end-point detection (EPD) and over polish, barrier removal, buffing, etc.), and each CMP operation has a unique process requirement. To maximize CMP system performance, CMP system 10 typically includes several CMP modules with each module uniquely optimized to meet the requirements for each CMP operation (e.g., customized process conditions and consumables).

As shown in FIG. 1, CMP system 10 includes a first linear CMP module (LPM1) 12, a second linear CMP module (LPM2) 14, and a third linear CMP module (LPM3) 16. In a typical configuration, LPM1 12 is configured for bulk copper removal, LPM2 14 is configured for EPD and over polish, and LPM3 16 is configured for barrier removal and buffing. After the CMP operations, CMP system 10 feeds the wafer to cleaning station 18 for cleaning. As is known to those skilled in the art, cleaning station 18 cleans the wafer by scrubbing with selected chemicals and water (e.g., de-ionized (DI) water).

One problem with the conventional setup of having separate systems specialized for CMP operations only or cleaning operations only is that the setup requires numerous, specialized modules within the CMP system or multiple functions to be performed within each module. Each additional CMP module or modules with multiple functions add to the size and complexity of the CMP system. Furthermore, transferring the wafer from one module to another module decreases throughput.

In view of the foregoing, there is a need to simplify the design and process of CMP systems and to increase throughput.

SUMMARY OF THE INVENTION

Broadly speaking, the present invention fills this need by providing a chemical mechanical planarization (CMP) pad, system, and methods for preparing a wafer in a cleaning module.

In accordance with a first aspect of the present invention, a CMP pad is provided. The CMP pad includes a cylindrical core and a CMP pad material disposed on an outer portion of the cylindrical core. In one embodiment, the CMP pad material is configured for buffing. In one embodiment, the CMP pad material is comprised of porous rubber. In one embodiment, the CMP pad material is configured for cleaning. In one embodiment, the cylindrical core is hollow. In one embodiment, the cylindrical core is solid. In one embodiment, the cylindrical core is comprised of stainless steel.

In accordance with a second aspect of the present invention, a method for preparing a wafer in a cleaning module is provided. In this method, slurry is dispensed onto a surface of a wafer. Next, a CMP operation is conducted in the cleaning module by contacting a surface of a brush with the surface of the wafer. Subsequently, a cleaning operation is conducted in the cleaning module.

In one embodiment, the brush is retrofitted with a CMP pad. In one embodiment, an outer portion of the brush is covered with the CMP pad in the retrofit. In one embodiment, relative motion is created between the surface of the brush and the surface of the wafer. In one embodiment, relative motion is created by rotating the brush about a central axis of the brush, the central axis being parallel to the surface of the wafer. In one embodiment, the relative motion is created by rotating the wafer about a central axis of the wafer, the central axis being perpendicular to the surface of the wafer. In one embodiment, the brush is configured to apply a constant and even pressure against the surface of the wafer.

In accordance with a third aspect of the present invention, a CMP system is provided. The CMP system includes a first brush and a second brush. The second brush is oriented relative to the first brush to receive a wafer between the first and second brushes. The CMP system also includes a first drive roller and a second drive roller. The first and second drive rollers are configured to receive an edge of the wafer to stabilize and rotate the wafer when placed between the first and second brushes. The CMP system also includes a slurry dispenser disposed above the two drive rollers and the slurry dispenser is configured to dispense slurry onto the surface of the wafer.

In one embodiment, the CMP system also includes a third drive roller. The first, second, and third drive rollers are configured to receive an edge of the wafer to stabilize and rotate the wafer when placed between the first and second brushes. In one embodiment, the CMP system includes a housing and the housing is configured to enclose the CMP system. In one embodiment, the CMP system includes a CMP pad covering an outer portion of the first brush. In one embodiment, the first and second brushes are comprised of polyvinyl alcohol (PVA).

In accordance with a fourth aspect of the present invention, a method for preparing a wafer in a cleaning module is provided. In this method, slurry is dispensed onto a surface of a wafer. Next, a CMP operation is conducted in the cleaning module by contacting a surface of a CMP pad material with the surface of the wafer. Subsequently, a cleaning operation is conducted in the cleaning module by rotating the CMP pad material with the surface of the wafer.

It is to be understood that the foregoing general description and the following detailed description are exemplary and explanatory only, and are not restrictive of the invention, as claimed.

BRIEF DESCRIPTION OF THE DRAWINGS

The accompanying drawings, which are incorporated in and constitute part of this specification, illustrate exemplary embodiments of the invention and together with the description serve to explain the principles of the invention.

DETAILED DESCRIPTION OF THE EXEMPLARY EMBODIMENTS

Several exemplary embodiments of the invention will now be described in detail with reference to the accompanying drawings.

Figure 1:
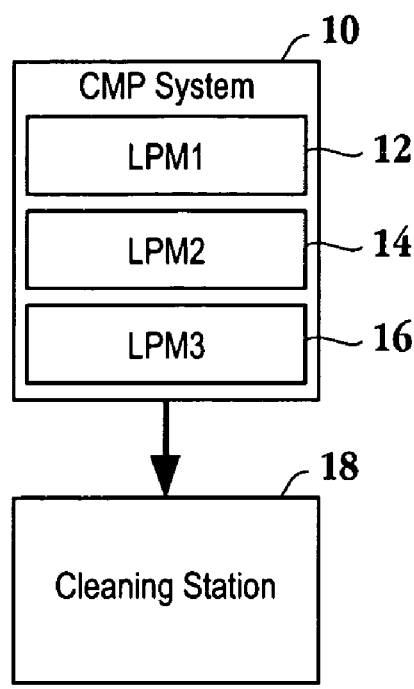
FIG. 1 is a simplified schematic diagram of a conventional CMP system and a cleaning station.
Figure 2A:
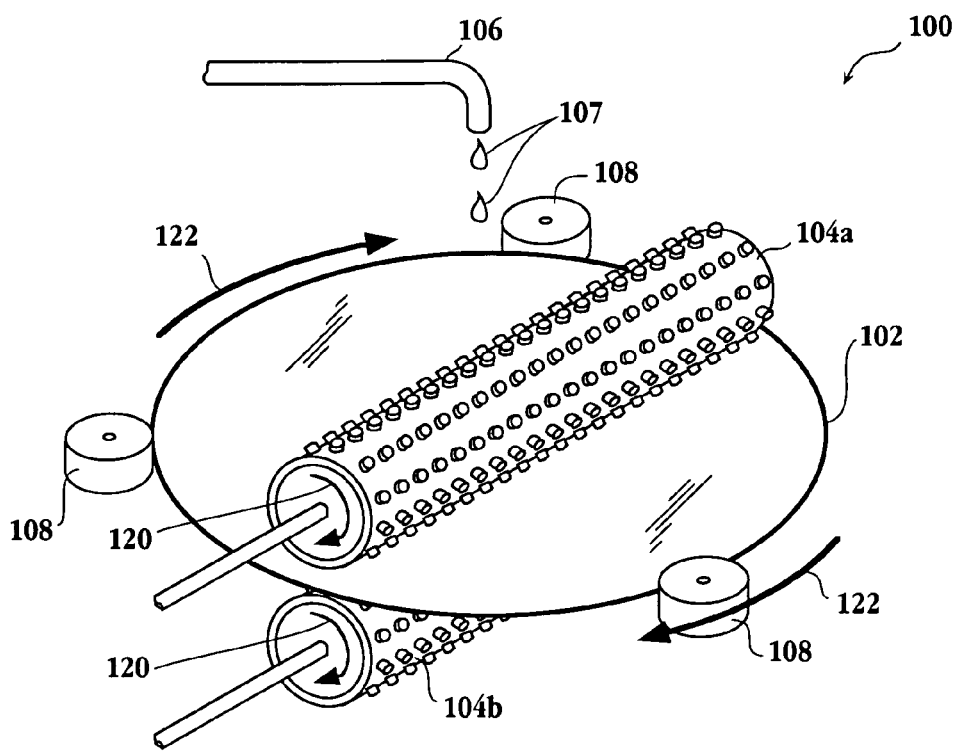
FIG. 2A is a simplified perspective view of a cleaning module, in accordance with one embodiment of the present invention.

FIG. 2A is a simplified perspective view of cleaning module 100, in accordance with one embodiment of the present invention. As shown in FIG. 2A, cleaning module 100, which is enclosed in a housing (not shown), includes top brush 104a and bottom brush 104b. Top brush 104a is oriented relative to bottom brush 104b so as to receive wafer 102 between the top brush and the bottom brush. Three drive rollers 108 are positioned to receive an edge of wafer 102 to support, stabilize, and rotate the wafer. In addition, slurry dispenser 106 is disposed above the drive rollers 108.

FIG. 2A shows a CMP operation being conducted in cleaning module 100. After wafer 102 is positioned between top brush 104a and bottom brush 104b, slurry dispenser 106 dispenses slurry 107 onto the surface of wafer 102. Slurry dispenser 106 may dispense slurry 107 at anytime throughout the CMP operation. Alternatively, after wafer 102 is positioned between top brush 104a and bottom brush 104b, slurry dispenser 106 dispenses slurry 107 onto the center of the wafer 102 while drive rollers 108 rotate the wafer to uniformly distribute slurry 107 across the entire surface of the wafer by centrifugal force.

After slurry dispenser 106 dispenses slurry 107, relative motion is created between the surfaces of top brush 104a and bottom brush 104b and the surfaces of wafer 102. In one manner, relative motion is created by rotating top brush 104a and bottom brush 104b in directions indicated by arrows 120. More specifically, top brush 104a and bottom brush 104b are rotating about their central axis whereby each central axis is parallel to the surface of wafer 102. In another manner, relative motion is created by rotating wafer 102 in directions indicated by arrows 122. More specifically, drive rollers 108 rotate wafer 102 about a central axis of the wafer whereby the central axis is perpendicular to the surface of the wafer.

Although FIG. 2A shows three drive rollers 108, two drive rollers may also be used in accordance with another embodiment of the present invention. In general, drive rollers 108 support, stabilize, and rotate wafer 102. The use of more drive rollers supporting wafer 102 result in better stabilization during the CMP operation. Therefore, although two rollers are sufficient to support and stabilize wafer 102, three rollers result in better stabilization during the CMP operation. The stabilization of wafer 102 during the CMP operation is important because the surface of the wafer needs to be uniformly planarized. Excessive movement of wafer 102 in any direction compromises uniform planarization.

Figure 2B:
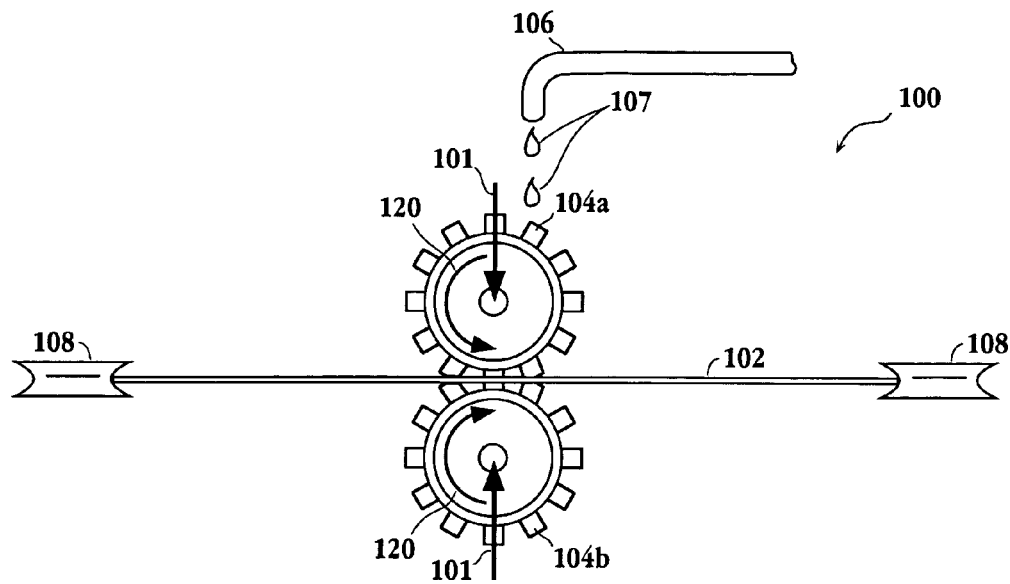
FIG. 2B is a simplified side view of a CMP operation being conducted in the cleaning module shown in FIG. 2A.

FIG. 2B is a simplified side view of the CMP operation being conducted in cleaning module 100 shown in FIG. 2A. To planarize the surface of wafer 102 uniformly, top brush 104a and bottom brush 104b apply a constant and even pressure against the surfaces of wafer 102 in directions indicated by arrows 101. As shown in FIG. 2B, top brush 104a and bottom brush 104b may be used to conduct the CMP operation. Top brush 104a and bottom brush 104b have a plurality of small surface mounds distributed in evenly spaced rows along the surface of the top brush and the bottom brush. Top brush 104a and bottom brush 104b can be made from polyvinyl alcohol (PVA), mohair, and other wrapped materials that are soft enough to prevent damage to circuit devices.

Figure 2C:
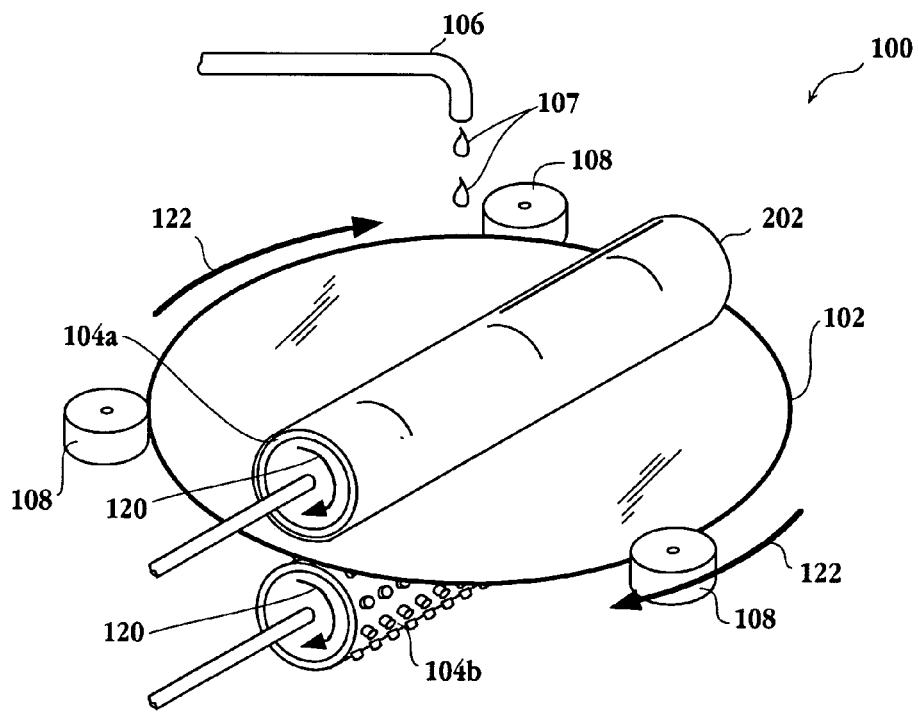
FIG. 2C is a simplified perspective view of a CMP operation being conducted in the cleaning module shown in FIG. 2A, in accordance with another embodiment of the present invention.
Figure 3A:
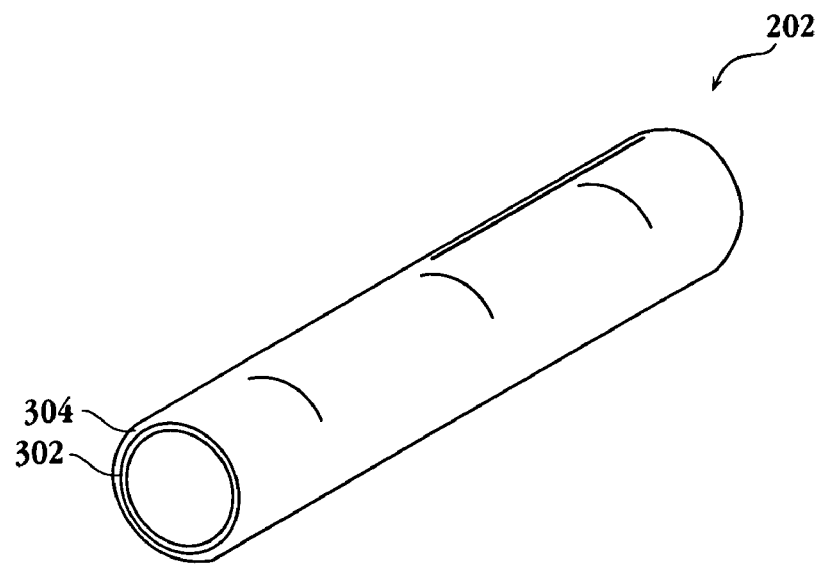
FIG. 3A is a detailed perspective view of a CMP pad shown in FIG. 2C.

FIG. 2C is a simplified perspective view of the CMP operation being conducted in cleaning module 100 shown in FIG. 2A, in accordance with another embodiment of the present invention. Instead of using top brush 104a directly to planarize the surface of wafer 102, top brush 104a is replaced with a CMP pad. Alternatively, as shown in FIG. 2C, top brush 104a may also be retrofitted with CMP pad 202. Retrofitting may be conducted by covering an outer portion of top brush 104a with CMP pad 202. For example, FIG. 3A is a detailed perspective view of CMP pad 202 shown in FIG. 2C. As shown in FIG. 3A, CMP pad 202 includes a hollow, cylindrical core 302 with CMP pad material 304 disposed on an outer portion of the hollow, cylindrical core. Hollow, cylindrical core 302 can be comprised of any suitable rigid material. For example, one suitable rigid material is stainless steel. CMP pad material 304 can be comprised of any material suitable for planarization. Examples of suitable CMP pad materials include porous rubber (e.g., Polytex) and polyurethane (e.g., Rodel IC1000™). To construct CMP pad 202, a sheet of CMP pad material 304 is wrapped around hollow, cylindrical core 302 and glued to the hollow, cylindrical core.

Figure 3B:
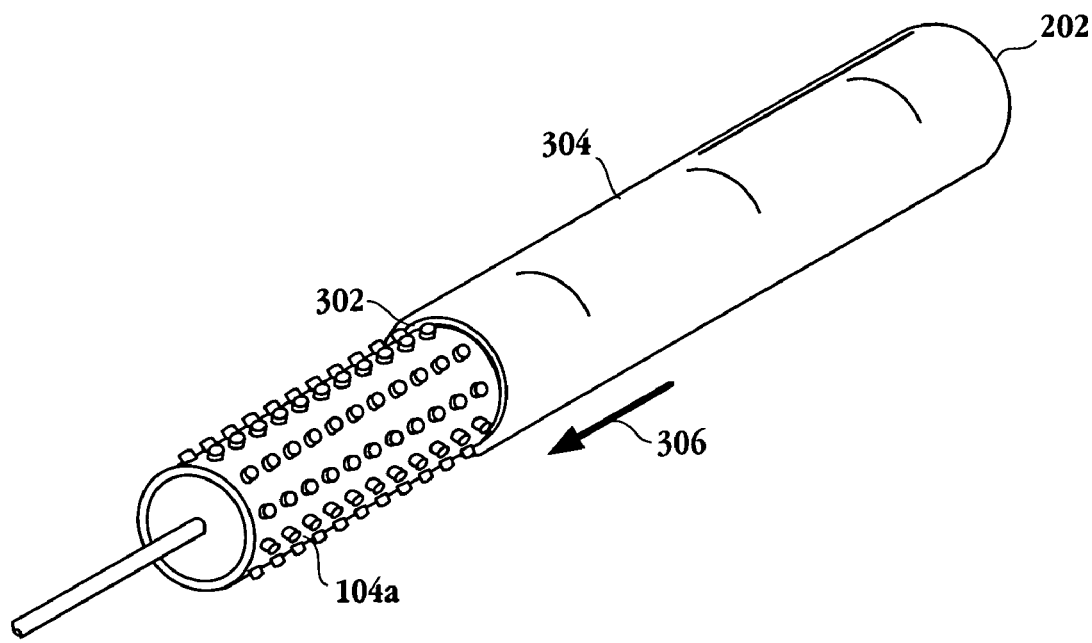
FIG. 3B is a detailed perspective view of a CMP pad shown in FIG. 2C sliding over a top brush.

To cover the outer portion of top brush 104a with CMP pad 202, the cylindrical, CMP pad 202 shown in FIG. 3A is designed to slide over top brush 104a. FIG. 3B is a detailed perspective view of CMP pad 202 shown in FIG. 2C sliding over top brush 104a in a direction indicated by arrow 306. In general, a brush, such as top brush 104a and bottom brush 104b, is an elongated, tubular core wrapped in a soft material, such as PVA. One way to fasten CMP pad 202 to top brush 104a is to design a diameter of hollow, cylindrical core 302 to be larger than the core of the top brush, but smaller than the overall diameter of the top brush when the top brush is wet. PVA shrinks when its dry and expands when its wet. Thus, the overall diameter of top brush 104a is smaller when the top brush is dry. When top brush 104a is dry, CMP pad 202 can easily slide over the top brush because the diameter of hollow, cylindrical core 302 is larger than the overall diameter of the top brush. CMP pad 202 is then fastened to top brush 104a by wetting the top brush. As the PVA of top brush 104a absorbs moisture, the PVA expands to exert a pressure on an inner surface of hollow, cylindrical core 302. The pressure prevents movement of hollow, cylindrical core 302 relative to top brush 104a and, as a result, fastens CMP pad 202 to the top brush.

Figure 4A:
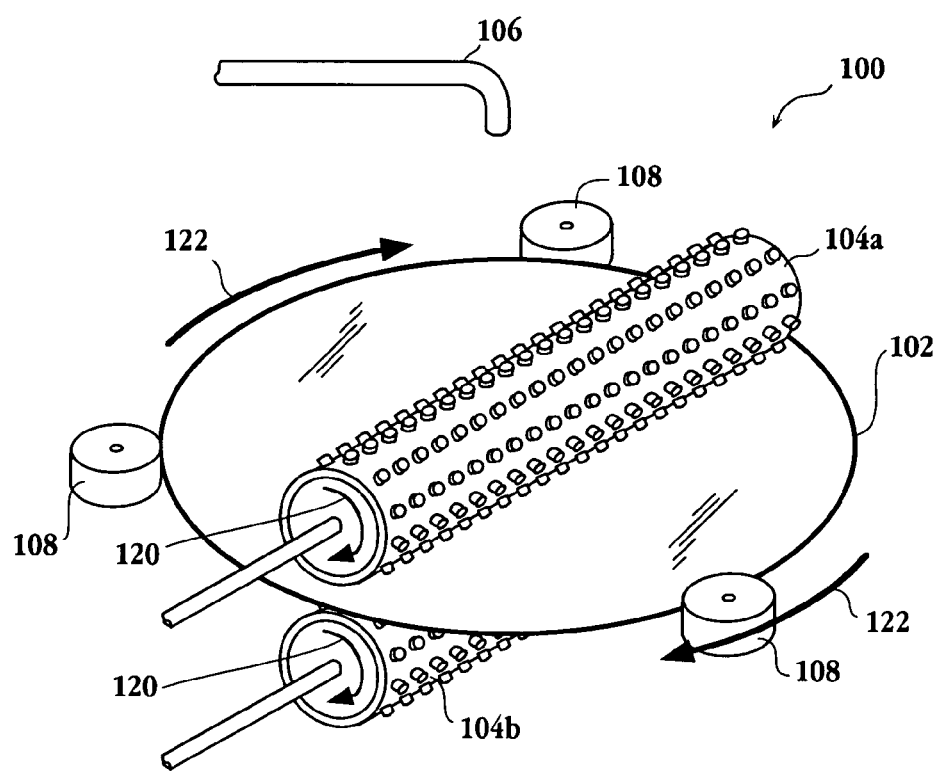
FIG. 4A is a simplified perspective view of a cleaning operation being conducted in cleaning module with top brush and bottom brush, in accordance with one embodiment of the present invention.

FIG. 4A is a simplified perspective view of a cleaning operation being conducted in cleaning module 100 with top brush 104a and bottom brush 104b, in accordance with one embodiment of the present invention. As shown in FIG. 4A, the cleaning operation is conducted by rotating wafer 102 in direction indicated by arrows 122. Top brush 104a and bottom brush 104b also rotates to scrub the surface of wafer 102 in direction indicated by arrows 120. A chemical cleaning fluid is generally applied to the surfaces of wafer 102 (not shown) through top brush 104a and bottom brush 104b as the top brush and the bottom brush scrub the surfaces of the wafer.

Figure 4B:
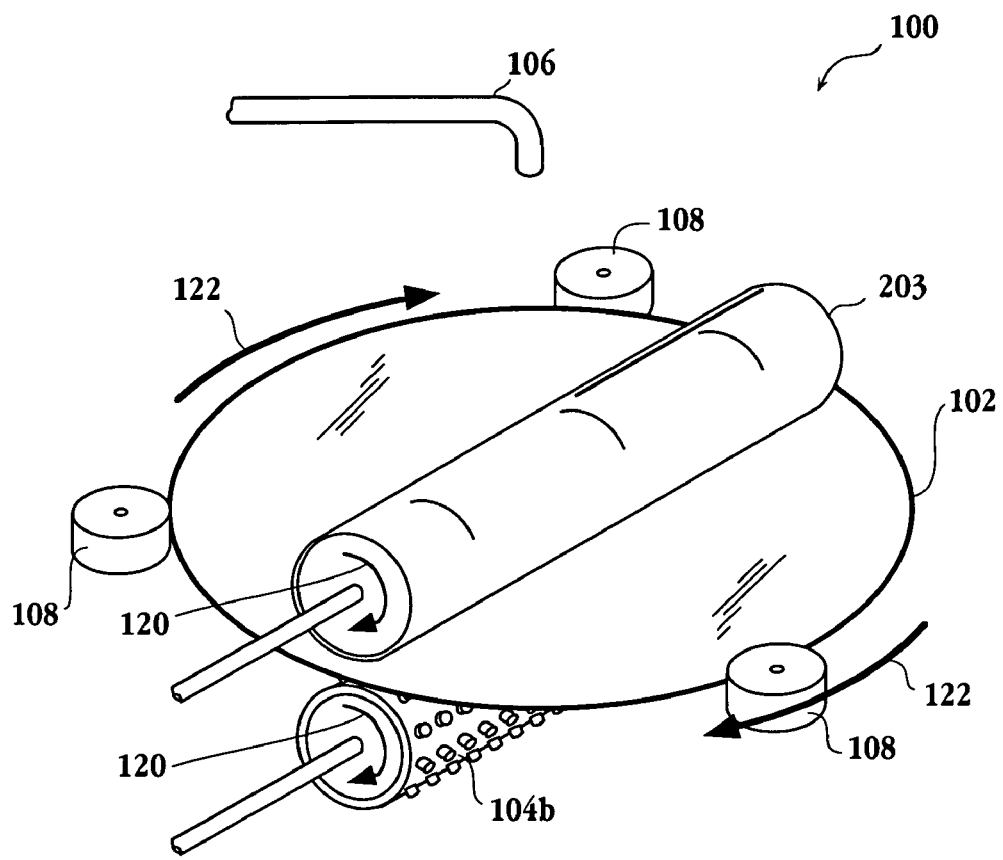
FIG. 4B is a simplified perspective view of a cleaning operation being conducted in cleaning module with CMP pad and bottom brush, in accordance with another embodiment of the present invention.

FIG. 4B is a simplified perspective view of a cleaning operation being conducted in cleaning module 100 with CMP pad 203 and bottom brush 104b, in accordance with another embodiment of the present invention. As shown in FIG. 4b, CMP pad 203 is oriented relative to bottom brush 104b to receive wafer 102 between the CMP pad and the bottom brush. Unlike the CMP pad 202 shown in FIGS. 2C, 3A, and 3B, CMP pad 303 has a solid, cylindrical core and cannot cover an outer portion of a brush. The use of CMP pad 202 with the solid, cylindrical core eliminates the need to retrofit an existing brush. In this configuration, the chemical cleaning fluid cannot be applied to the surface of wafer 102 through CMP pad 202 because the CMP pad has a solid, cylindrical core. Instead, the chemical cleaning fluid may be applied by other means, such as an external drip applicator (not shown). After chemical scrubbing, the surface of wafer 102 is cleaned with water (preferably DI water). If the chemical cleaning fluid is left on the surface of wafer 102, the chemicals may cause unwanted reactions in subsequent cleaning and post-cleaning operations.

In short, FIGS. 2A, 2B, and 4A show cleaning module 100 preparing wafer 102 by first dispensing slurry 107 onto the surface of the wafer. Thereafter, a CMP operation is conducted in cleaning module 100 by contacting the surface of top brush 104a with the surface of wafer 102. After the completion of the CMP operation, a cleaning operation is conducted in cleaning module 100. Alternatively, FIGS. 2C and 4B show cleaning module 100 preparing wafer 102 by first dispensing slurry 107 onto the surface of the wafer. Thereafter, a CMP operation is conducted in cleaning module 100 by contacting a surface of a CMP pad material with the surface of wafer 102. After the completion of the CMP operation, a cleaning operation is conducted in cleaning module 100 by contacting the CMP pad material with the surface of wafer 102.

The present invention can be used in conjunction with a CMP system to improve process performance, increase throughput, simplify the CMP system design, or eliminate one CMP module in the CMP system. An exemplary embodiment includes a CMP system with three linear CMP modules all similarly configured for CMP polishing: a first linear CMP module (LPM1) is configured for bulk copper removal; a second linear CMP module (LPM2) is configured for EPD and over polish; and a third linear CMP module (LPM3) is configured for barrier removal only. After LPM1, LPM2, and LPM3 process a wafer, the CMP system feeds the wafer to a cleaning station for CMP buffing and cleaning.

The exemplary cleaning station only has one cleaning module. The cleaning module includes a CMP pad with a solid, cylindrical core and a bottom brush. A CMP pad material comprised of Polytex is disposed on an outer portion of the CMP pad. Initially, the CMP pad and the bottom brush lift away to receive the wafer, slurry dispenser then dispenses slurry into the center of the wafer while the drive rollers rotate the wafer to distribute the slurry across the entire surface of the wafer. Then the CMP pad and the bottom brush lower toward the wafer to make contact with the surfaces of the wafer to start the CMP operation.

The wafer, the CMP pad, and the bottom brush then rotate to buff a surface of the wafer. By way of example, wafer rotates in the range from about 1 rpm to about 120 rpm during buffing. As used herein, the term "about" means that the specified dimension or parameter may be varied within an acceptable manufacturing tolerance for a given application. In one embodiment, the acceptable manufacturing tolerance is ±10%. At the same time, the CMP pad and the bottom brush apply a constant and even pressure against the surfaces of the wafer. By way of example, the CMP pad and bottom brush apply a pressure in the range from about 1.0 psi to about 6.0 psi during buffing. After a surface of the wafer is buffed, chemical cleaning fluids and DI water are applied to the surfaces of the wafer while the top brush and the bottom brush rotate to scrub and clean the wafer.

As a result, the transfer of the CMP buffing operation from the CMP system to the cleaning station eliminates a buffing step in the CMP system. By transferring the buffing operation from the CMP system to the cleaning station, the CMP system can use a hard pad (e.g., Rodel IC1000™) for all three LPM1, LPM2, and LPM3 modules, which optimizes planarity performance. Furthermore, conducting both a CMP operation and a cleaning operation in one cleaning module decrease wafer transfers and increase throughput. Additionally, depending on the actual CMP process, a CMP module could be eliminated to simplify system design.

In summary, the present invention provides a CMP system and a method for preparing a wafer in which a CMP operation and a cleaning operation are conducted in one cleaning module. The invention has been described herein in terms of several exemplary embodiments. Other embodiments of the invention will be apparent to those skilled in the art from consideration of the specification and practice of the invention. The embodiments and preferred features described above should be considered exemplary, with the invention being defined by the appended claims and equivalents thereof.

What is claimed is:

1. A chemical mechanical planarization (CMP) system, comprising:
    a first brush having a CMP pad covering an outer portion of the first brush;
    a second brush, the second brush being oriented relative to the first brush to receive a wafer between the first and second brushes;
    a first drive roller;
    a second drive roller, the first and second drive rollers being configured to receive an edge of the wafer to stabilize and rotate the wafer when placed between the first and second brushes; and
    a slurry dispenser disposed above the two drive rollers, the slurry dispenser being configured to dispense slurry onto the surface of the wafer.

2. The CMP system of claim 1, further comprising:
    a third drive roller, the first, second, and third drive rollers being configured to receive an edge of the wafer to stabilize and rotate the wafer when placed between the first and second brushes.

3. The CMP system of claim 1, further comprising:
a housing, the housing being configured to enclose the CMP system.

4. The CMP system of claim 1, wherein the first brush and the second brush apply a pressure between about 1 pound per square inch and about 6 pounds per square inch to corresponding surfaces of the wafer.

5. The CMP system of claim 4, wherein the CMP pad includes:
a cylindrical core; and
a CMP pad material disposed on an outer portion of the cylindrical core.

6. The CMP system of claim 5, wherein the CMP pad material is configured for buffing.

7. The CMP system of claim 5, wherein the CMP pad material is comprised of porous rubber.

8. The CMP system of claim 5, wherein the CMP pad material is configured for cleaning.

9. The CMP system of claim 1, wherein the first and second brushes are comprised of polyvinyl alcohol (PVA).

* * * * *